United States Patent
Shimotsusa et al.

(10) Patent No.: US 9,094,624 B2
(45) Date of Patent: Jul. 28, 2015

(54) SOLID-STATE IMAGING APPARATUS AND CAMERA

(71) Applicant: CANON KABUSHIKI KAISHA, Tokyo (JP)

(72) Inventors: Mineo Shimotsusa, Machida (JP); Takehiko Soda, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/265,711

(22) Filed: Apr. 30, 2014

(65) Prior Publication Data

US 2014/0340541 A1 Nov. 20, 2014

(30) Foreign Application Priority Data

May 15, 2013 (JP) .................................. 2013-103535

(51) Int. Cl.
*H04N 5/225* (2006.01)
*H04N 5/355* (2011.01)
*H01L 27/146* (2006.01)
*H01L 31/062* (2012.01)

(52) U.S. Cl.
CPC ............ *H04N 5/355* (2013.01); *H01L 27/1464* (2013.01); *H01L 27/14627* (2013.01); *H01L 27/14641* (2013.01); *H01L 27/14643* (2013.01)

(58) Field of Classification Search
USPC ........... 348/294, 340; 257/291, 294, 432–434
See application file for complete search history.

(56) References Cited

U.S. PATENT DOCUMENTS

| 7,411,170 | B2 | 8/2008 | Shimotsusa et al. | |
|---|---|---|---|---|
| 7,592,578 | B2 | 9/2009 | Shimotsusa et al. | |
| 7,825,001 | B2* | 11/2010 | Uya ............................ | 438/401 |
| 7,935,557 | B2 | 5/2011 | Mishima et al. | |
| 8,163,588 | B2 | 4/2012 | Mishima et al. | |
| 8,274,122 | B2 | 9/2012 | Shimotsusa | |
| 8,349,640 | B2 | 1/2013 | Soda | |
| 8,698,208 | B2 | 4/2014 | Mishima et al. | |
| 8,779,544 | B2 | 7/2014 | Yamashita et al. | |
| 8,941,158 | B2* | 1/2015 | Iida et al. ....................... | 257/291 |
| 2010/0320507 | A1* | 12/2010 | Uya ............................ | 257/228 |
| 2010/0327390 | A1* | 12/2010 | McCarten et al. ............ | 257/447 |
| 2011/0049590 | A1 | 3/2011 | Itonaga | |
| 2012/0085888 | A1* | 4/2012 | Endo et al. ................. | 250/208.1 |
| 2013/0141617 | A1 | 6/2013 | Soda | |

(Continued)

FOREIGN PATENT DOCUMENTS

JP 2011-049446 A 3/2011

*Primary Examiner* — Ngoc-Yen Vu (74) *Attorney, Agent, or Firm* — Fitzpatrick, Cella, Harper & Scinto (57) ABSTRACT

A solid-state imaging apparatus which includes a semiconductor portion having a first face on the light incident side and a second face opposite to the first face, and an optical system arranged on the first face, comprising a first semiconductor region of a first conductivity type provided on the second face side in the semiconductor region, a photoelectric conversion portion provided in the semiconductor portion so as to surround the first semiconductor region, including a second semiconductor region of the first conductivity type, and a gate electrode arranged between the first and the second semiconductor regions on the second face, for transferring a charge generated in the photoelectric conversion portion to the first semiconductor region, wherein the optical system is configured so that a light intensity in the second semiconductor region is higher than that in the first semiconductor region.

11 Claims, 11 Drawing Sheets

(56) References Cited

U.S. PATENT DOCUMENTS

2013/0222657 A1 8/2013 Shimotsusa
2014/0111663 A1 4/2014 Soda
2014/0132812 A1 5/2014 Soda
2014/0160355 A1 6/2014 Shimotsusa

* cited by examiner

ND CAMERA

BACKGROUND OF THE INVENTION

1. Field of the Invention

The present invention relates to a solid-state imaging apparatus and camera.

2. Description of the Related Art

A solid-state imaging apparatus can include a photoelectric conversion portion, a floating diffusion (to be referred to an FD hereinafter), and a transfer transistor which transfers charges generated and accumulated in the photoelectric conversion portion to the FD. A signal corresponding to an FD potential is obtained as a pixel signal from the solid-state imaging apparatus.

Japanese Patent Laid-Open No. 2011-049446 discloses a back-side illumination solid-state imaging apparatus in which an FD is provided in the center of a pixel region, a photoelectric conversion portion is provided on the periphery of the pixel region so as to surround this FD, and the gate electrode of a transfer transistor is formed annularly.

According to the structure disclosed in Japanese Patent Laid-Open No. 2011-049446, since photoelectric conversion is also performed in the FD, the FD potential changes before a charge is transferred from the photoelectric conversion portion to the FD. This reduces a dynamic range. For example, when a luminance is high, the output from a pixel or a readout unit which reads out the pixel exceeds its saturation level.

SUMMARY OF THE INVENTION

The present invention provides a solid-state imaging apparatus advantageous in improving charge transfer efficiency while maintaining a dynamic range.

One of the aspects of the present invention provides a solid-state imaging apparatus which includes a semiconductor portion having a first face on the light incident side and a second face which is opposite to the first face, and an optical system arranged on the first face of the semiconductor portion, comprising a first semiconductor region of a first conductivity type configured to be provided on the second face side in the semiconductor region, a photoelectric conversion portion configured to be provided in the semiconductor portion so as to surround the first semiconductor region, and include a second semiconductor region of the first conductivity type, and a gate electrode configured to be arranged between the first semiconductor region and the second semiconductor region on the second face of the semiconductor portion, and transfer a charge generated in the photoelectric conversion portion to the first semiconductor region, wherein the optical system is configured so as to make a light intensity in the second semiconductor region higher than that in the first semiconductor region.

Further features of the present invention will become apparent from the following description of exemplary embodiments with reference to the attached drawings.

DESCRIPTION OF THE EMBODIMENTS (Examples of Circuit Arrangement of Pixel and Solid-State Imaging Apparatus)

Figure 1:
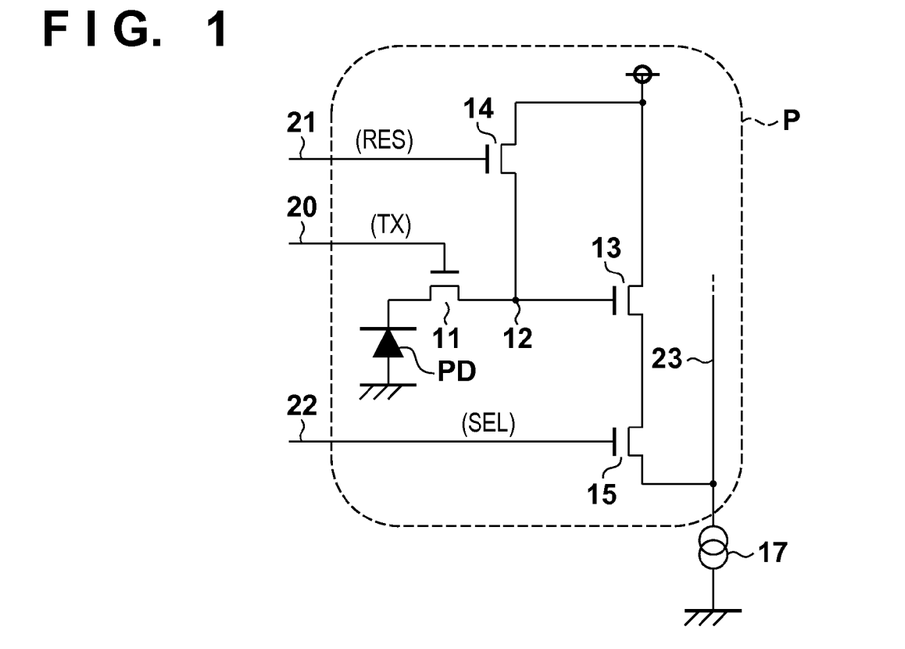
FIG. 1 is a circuit diagram for explaining an example of the circuit arrangement of a pixel.

FIG. 1 shows an example of the circuit arrangement of a pixel P. The pixel P can include a photoelectric conversion portion PD (for example, a photodiode), transfer transistor 11, floating diffusion (to be referred to FD 12 hereinafter), source follower transistor 13, reset transistor 14, and selection transistor 15. A control signal TX is supplied to the gate terminal of the transfer transistor 11 via a control signal line 20. When the control signal TX is activated, the transfer transistor 11 transfers, to the FD 12 (the drain region of the transfer transistor 11), charges which have been generated upon receiving light in the photoelectric conversion portion PD. The FD 12 is connected to the gate terminal of the source follower transistor 13, and the source potential of the source follower transistor 13 changes according to a change in charge amount transferred to the FD 12. A control signal SEL is supplied to the gate terminal of the selection transistor 15 via a control signal line 22. When the control signal SEL is activated, the selection transistor 15 can output a pixel signal corresponding to the gate potential of the source follower transistor 13 to a column signal line 23. Furthermore, a control signal RES is supplied to the gate terminal of the reset transistor 14 via a control signal line 21. When the control signal RES is activated, the reset transistor 14 can reset the potential of the FD 12.

Figure 2:
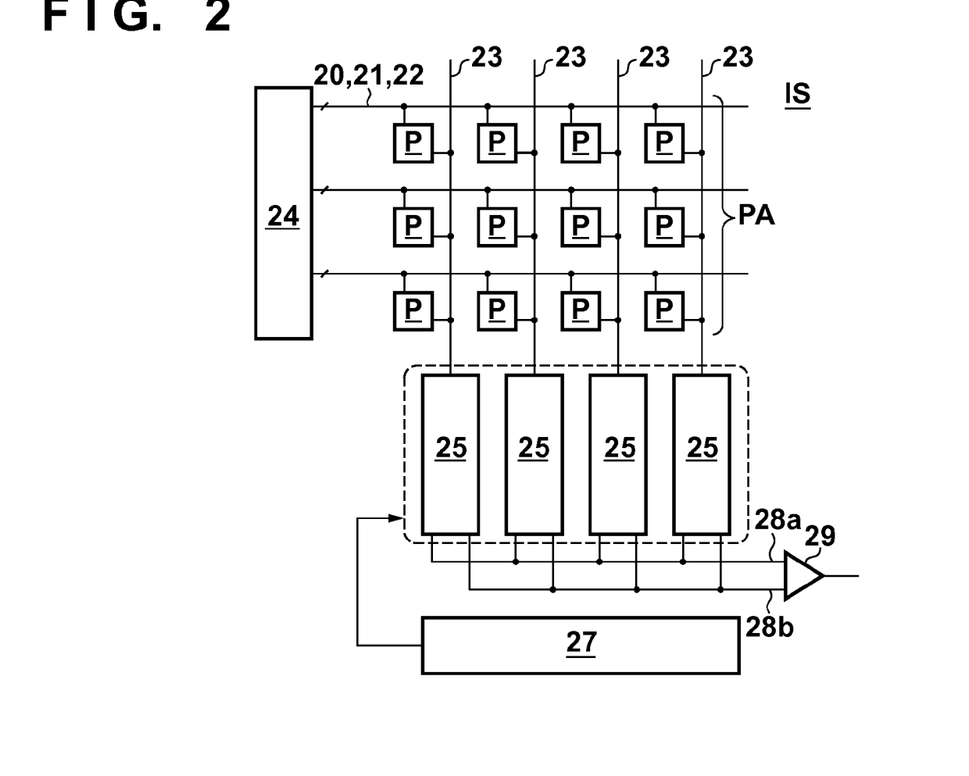
FIG. 2 is a block diagram for explaining an example of the arrangement of a solid-state imaging apparatus.

FIG. 2 shows an example of the circuit arrangement of a solid-state imaging apparatus IS. The solid-state imaging apparatus IS can include a pixel array PA, driving unit 24, readout units 25, control unit 27, and output unit 29. The pixel array PA includes a plurality of pixels P arrayed to form a plurality of rows and a plurality of columns. For the sake of better understanding, FIG. 2 shows an arrangement arrayed with 3 (row)×4 (column).

The driving unit 24 includes a shift resistor or the like, outputs the aforementioned control signal to the pixel array PA in response to a clock signal, and drives the respective pixels P for each row. Each readout unit 25 is provided in correspondence with each column, and reads out, for each column, a pixel signal from each pixel P which is output in accordance with the aforementioned control signal. The respective pixel signals read out by the readout units 25 can undergo horizontal transferring via signal lines 28a and 28b in accordance with the control signal from the control unit 27, and be output sequentially for each column from the output unit 29.

The pixel signals can be read out by the circuit arrangement according to, for example, a Correlated Double Sampling (CDS) method. For example, the readout unit 25 can include a signal holding unit or the like, and clamp in advance, as a noise level, an output obtained when the potential of the FD 12 is reset in reading out the pixel signals from the each pixel P. Then, noise can be removed by reading out the difference between signal read out from the pixel P and this noise level. This difference can be amplified in the output unit 29 and output as a pixel signal.

First Embodiment

Figure 3A:
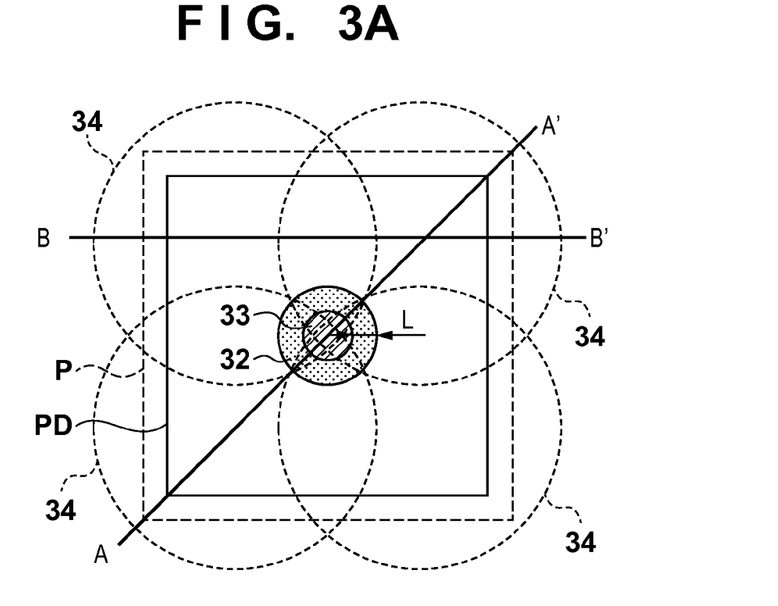
FIGS. 3A to 3D are views for explaining an example of the arrangement of a solid-state imaging apparatus according to the first embodiment.
Figure 3B:
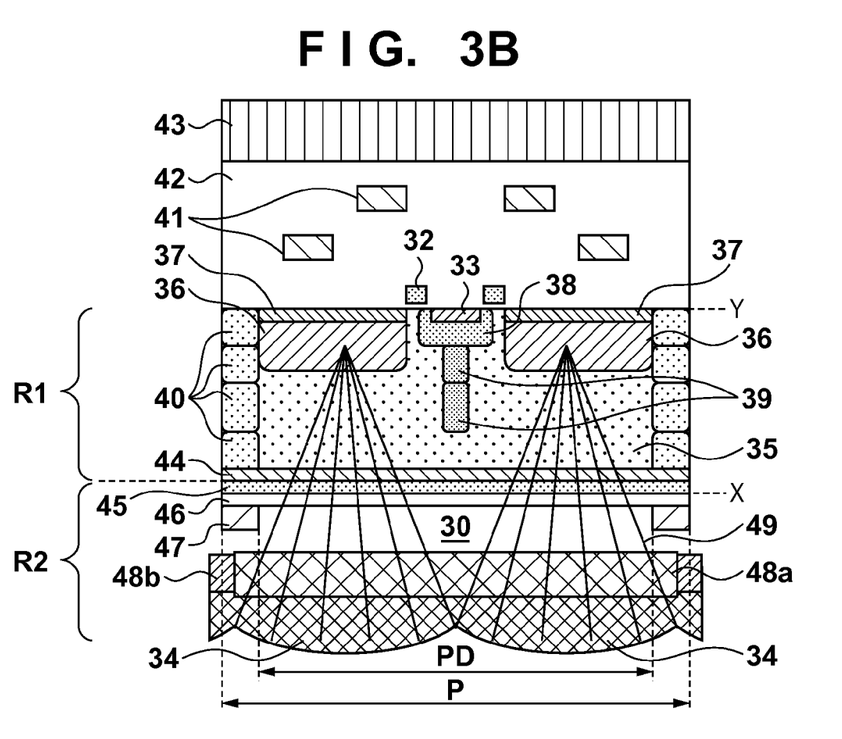
Figure 3C:
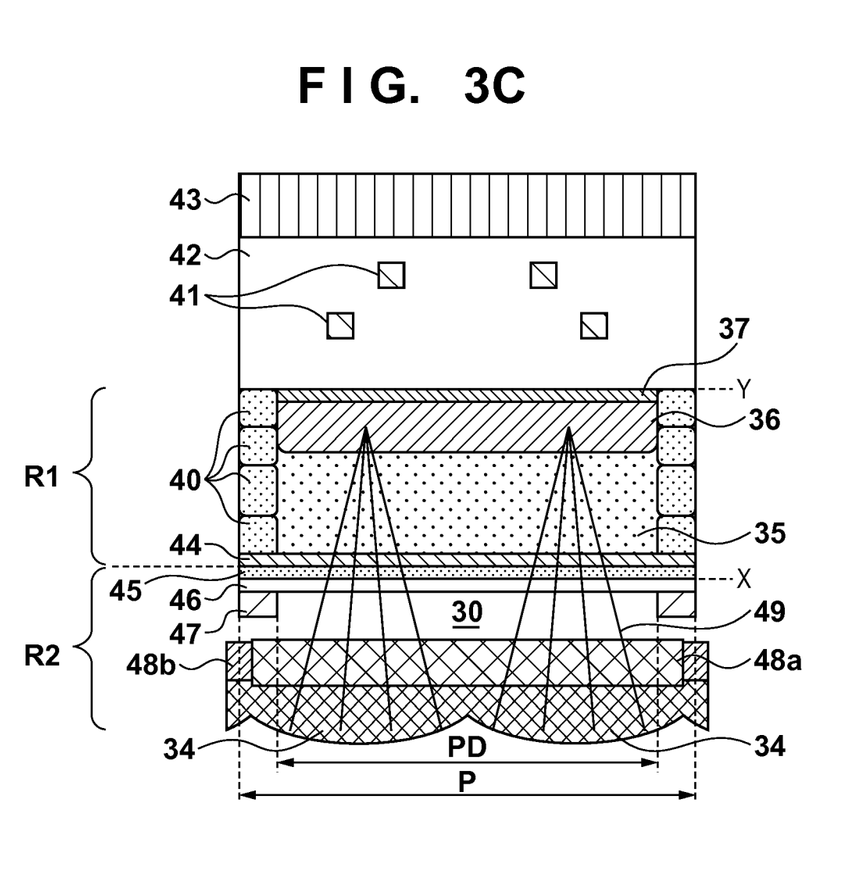
Figure 3D:
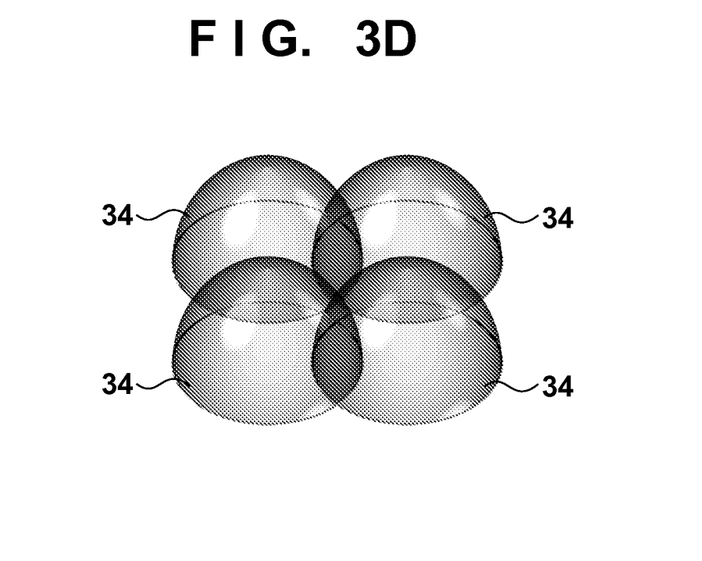

A solid-state imaging apparatus $IS_1$ according to the first embodiment will be described with reference to FIGS. 3A to 5. FIGS. 3A to 3D schematically show an example of the arrangement of a unit pixel P in the solid-state imaging apparatus $IS_1$. FIG. 3A is a plan view of the pixel P. FIG. 3B is a sectional structural view taken along a cut line A-A' in FIG. 3A, and FIG. 3C is a sectional structural view taken along a cut line B-B'. In addition, FIG. 3D shows an example of the arrangement of an optical system arranged in correspondence with the pixel P.

The solid-state imaging apparatus $IS_1$ can include a semiconductor portion R1 which has an X face (first face) and Y face (second face) opposing each other, and an optical system R2 which is arranged on the X face side of the semiconductor portion R1. The X face side is a face side on which light to the solid-state imaging apparatus $IS_1$ enters. Therefore, the solid-state imaging apparatus $IS_1$ is of a back-side illumination type.

On the Y face side (opposite to the light incident X face) in the semiconductor portion R1, in the central region of the pixel P, a p-type well 38 and n-type semiconductor region 33 are provided to form the aforementioned FD 12. In addition, an n-type semiconductor region 35, n-type semiconductor region 36, and p-type semiconductor region 37 are provided so as to surround the p-type well 38 and n-type semiconductor region 33. The aforementioned photoelectric conversion portion PD is configured to include the n-type semiconductor region 35, a part of the n-type semiconductor region 36, and the p-type semiconductor region 37. Furthermore, a p-type semiconductor region 39 whose width is smaller than that of the p-type well 38 can be formed under the p-type well 38.

Furthermore, a gate electrode 32 for transferring charges generated in the photoelectric conversion portion PD from the n-type semiconductor region 36 to the n-type semiconductor region 33 is arranged on the Y face of the semiconductor portion R1 via an insulating film. The gate electrode 32 is arranged outside the n-type semiconductor region 33, and in a plan view (see FIG. 3A), formed in an annular pattern (a width L, that is, a gate length L). The aforementioned transfer transistor 11 is thus configured, and can be provided in the central region of the pixel P for improving charge transfer efficiency. Note that although FIG. 3A shows a perfect circular pattern, the pattern is not limited to this shape, but may be, for example, a rectangular shape or even a structure a part of which is removed. In the structure the part of which is removed, a heavily doped p-type semiconductor region or insulator can be provided in this removed portion to electrically isolate the n-type semiconductor region 33 from the n-type semiconductor region 35 or the n-type semiconductor region 33 from the n-type semiconductor region 36.

Note that a negative bias can be applied to the gate electrode 32 while setting the transfer transistor 11 in a non-conductive state (that is, accumulating charges generated in the photoelectric conversion portion PD). At this time, positive holes are accumulated near the surface of the semiconductor portion R1 under the gate electrode 32 to set a so-called hole pinning state. This can suppress a dark current caused by the interface trap between the semiconductor portion R1 and insulating film, and also prevent the generation of white spots at the time of image capturing.

Note that although not shown here, other transistors (the source follower transistor 13, reset transistor 14, and selection transistor 15) can be arranged in the peripheral region of the pixel P.

On the X face side of the semiconductor portion R1, a p-type semiconductor region 44 (second semiconductor region) is provided, and a reference voltage (for example, a ground potential) can be supplied. Furthermore, the pixel P can be divided by a p-type element isolation region 40. The element isolation region 40 is electrically connected to the p-type semiconductor region 44 to electrically isolate adjacent pixels. Furthermore, this arrangement can suppress a dark current which can be caused at an interface between a semiconductor substrate or the semiconductor portion R1 and the insulating film.

The optical system R2 is provided on the X face side of the semiconductor portion R1. An antireflection film 45, insulating layer 46, light-shielding unit 47, planarizing layer 30, color filters 48a and 48b, microlenses 34 and the like can be arranged sequentially from the X face side. The antireflection film 45 is formed from an inorganic material such as an insulating film or the like, and prevents the reflection of light having passed through the microlenses 34. The light-shielding unit 47 can be provided so as to prevent color mixture between adjacent pixels. The color filters 48a and 48b can be provided in correspondence with the respective pixels P, for example according to the Bayer arrangement.

Also, on the Y face side of the semiconductor portion R1, in addition to the gate electrode 32, an insulating member 42 which is provided so as to cover the gate electrode 32, and a wiring pattern 41 which is provided inside the insulating member 42 can be arranged. They can be arranged in a multilayer wiring structure in which an interlayer insulating film and wiring layer are alternately provided. Furthermore, a support unit 43 which supports the insulating member 42, semiconductor portion R1, and optical system R2 can be arranged on the insulating member 42.

Here, the microlenses 34, as shown in FIG. 3A, when viewed from above with respect to the X face, can be formed to position their centers outside the outer edge of the n-type semiconductor region 33. This makes it possible to form a light intensity distribution in the semiconductor portion R1 so as to make a light intensity higher outside of the n-type semiconductor region 33 than inside thereof. The microlenses 34, as illustrated in FIGS. 3A and 3D, may be formed in a so-called gapless manner in an opposite side direction or diagonal direction.

The microlenses 34 can be formed by a well-known manufacturing method. For example, a resist pattern is formed on a lens member to be a material for the microlenses 34, and this resist pattern is reflowed by the heat to obtain the resist pattern of a convex shape. Then, the convex shape of the resist pattern can be transferred to the lens material by etching this resist pattern of the convex shape and the lens material to form the microlenses 34. The microlenses 34 can also be formed by performing an exposure process and development process, as another manufacturing method of the microlenses 34, using a gray scale mask having tonality.

Figure 4:
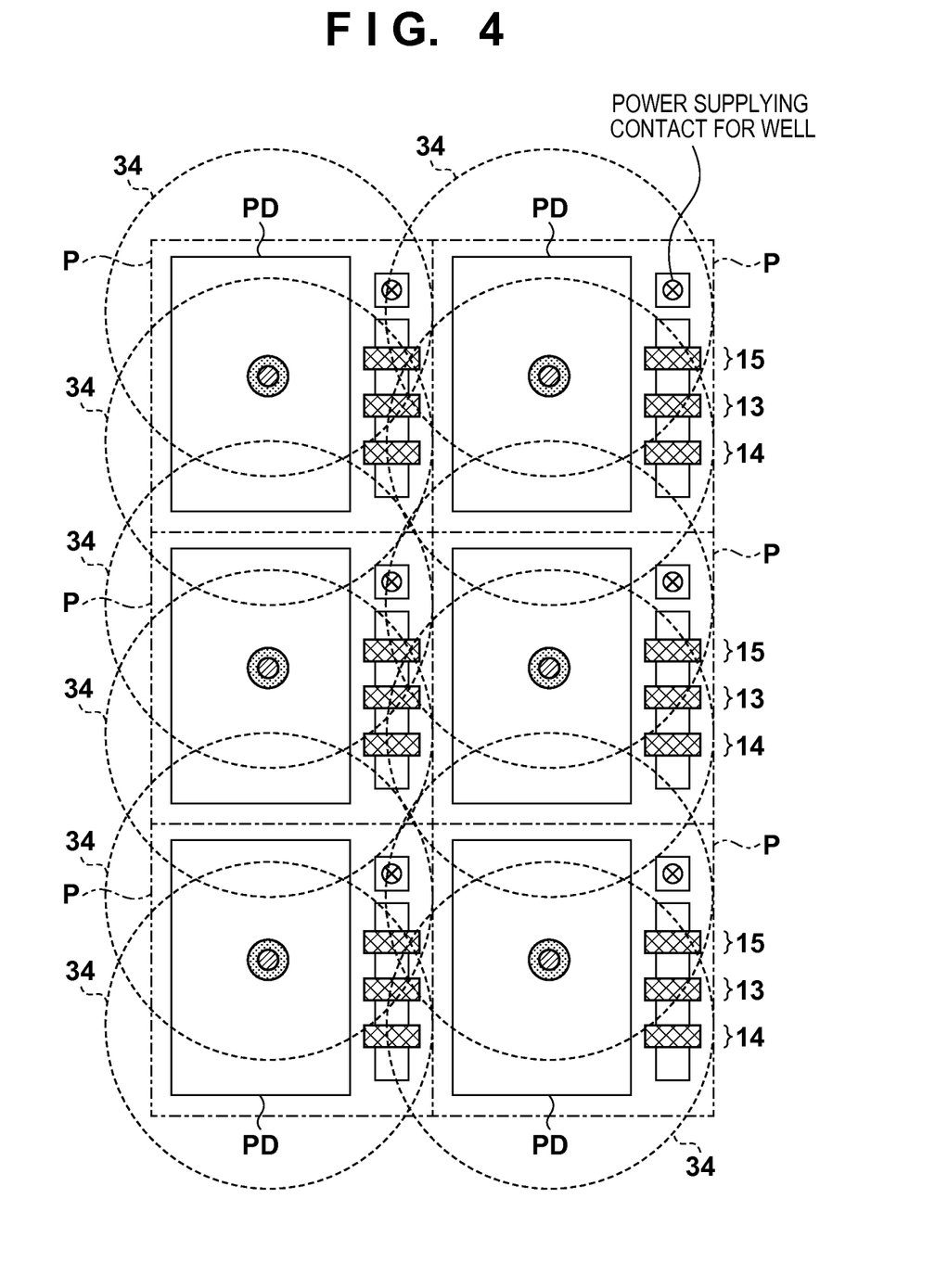
FIG. 4 is a view for explaining another example of the arrangement of the solid-state imaging apparatus according to the first embodiment.

Note that although the structure in which four microlenses 34 are arranged in the unit pixel P is exemplified in the first embodiment, the structure is not limited to this and suffices to be arranged so as to make the light intensity higher outside of the n-type semiconductor region 33 than inside thereof. For example, as shown in FIG. 4, the structure in which two microlenses 34 are arranged for each unit pixel P may be possible. Also in this structure, the center of each microlens 34 is positioned outside the outer edge of the n-type semiconductor region 33.

Figure 5:
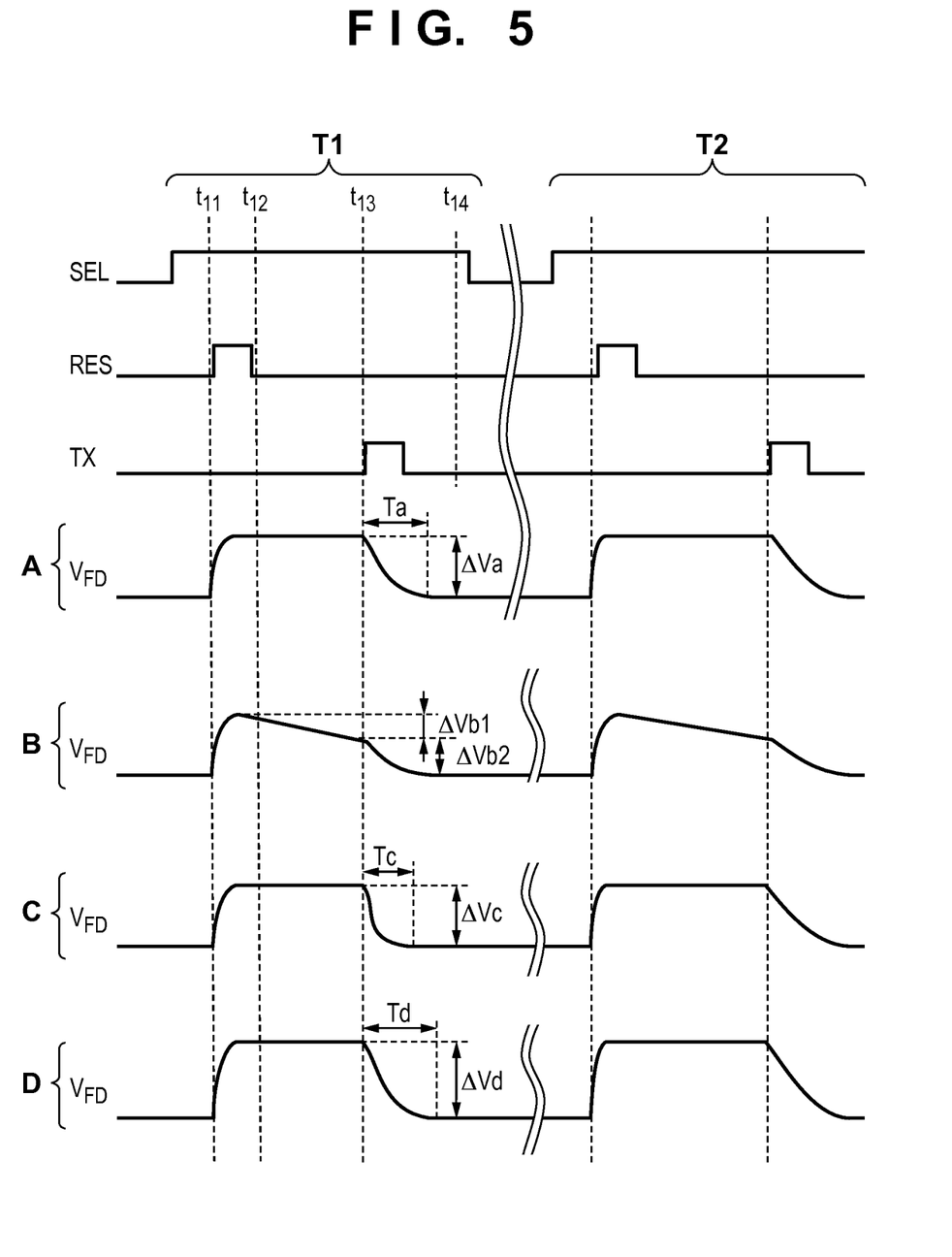
FIG. 5 is a view for explaining an example of the operation sequence of the solid-state imaging apparatus.

The operation sequence of the solid-state imaging apparatus $IS_1$ and a potential $V_{FD}$ of the FD 12 in this operational sequence will be described below with reference to FIG. 5. FIG. 5 is a view, with the abscissa representing the time, showing the respective control signals (SEL, RES, and TX), and the potentials $V_{FD}$ of the FDs 12 for respective cases (A) to (D).

In the case (A) illustrated as the first comparative example, the transfer transistor 11 is provided not in the central region of the pixel P but in the peripheral region of the pixel P together with other transistors (such as the source follower transistor 13). Hence, according to the case (A), the transfer transistor 11 is provided at the end of the pixel P, and the transfer efficiency of charges from the entire photoelectric conversion portion PD can be lower than that in the first embodiment.

In the case (B) illustrated as the second comparative example, the light intensity distribution is configured so as to make the light intensity higher inside of the n-type semiconductor region 33 than outside thereof in the structure where the transfer transistor 11 is provided in the central region of the pixel P. Hence, according to the case (B), since the transfer transistor 11 is provided near the center of the pixel P, charge transfer efficiency is higher than that in the case (A). However, the light having passed through the microlenses 34 can be condensed mainly near the FD 12 (the n-type semiconductor region 33 in the case (B)).

In the cases (C) and (D) illustrate the potentials $V_{FD}$ according to the first embodiment, and the situation in which the light intensity distribution is configured so as to make the light intensity higher outside of the n-type semiconductor region 33 than inside thereof in the structure where the transfer transistor 11 is provided in the central region of the pixel P. Hence, according to the cases (C) and (D), since the transfer transistor 11 is provided near the center of the pixel P, charge transfer efficiency is higher than that in the case (A). Furthermore, according to the cases (C) and (D), the light having passed through the microlenses 34 can be condensed mainly near the photoelectric conversion portion PD (the n-type semiconductor region 36 or n-type semiconductor region 35 in the cases (C) and (D)).

In a period T1, the control signal SEL is activated via the control signal line 22, and the selection transistor 15 of the pixel P in the row where the pixel signal should be read out is set in a conductive state. At time $t_{11}$, the control signal RES is activated via the control signal line 21 to set the reset transistor 14 in the conductive state, and the potential $V_{FD}$ will be a reset potential. At time $t_{12}$ after resetting, an output from the pixel P is obtained as a noise level. Note that when letting a power supply voltage be, for example, 3.3 V, the reset potential will be about 3.0 V through the reset transistor. Then, at time $t_{13}$, the control signal TX is activated via the control signal line 20 to set the transfer transistor 11 in the conductive state, charges in the photoelectric conversion portion PD are transferred to the FD 12, and the potential $V_{FD}$ decreases to about, for example, 2.0 V. Then, at time $t_{14}$ for example, the output from the pixel P after transferring charges is read out as a signal level, and a signal corresponding to the difference between this signal level and the aforementioned noise level is obtained as a pixel signal. Furthermore, when obtaining an additional pixel signal, a similar operation can be performed in a period T2.

In the operation sequence described above, according to the case (A) as the first comparative example, the potential $V_{FD}$ decreases by transferring charges after resetting. Note that the period in which the potential $V_{FD}$ is decreasing from time $t_{13}$ is referred to as a period Ta, and its change amount is referred to as ΔVa.

On the other hand, according to the case (B) as the second comparative example, the light having passed through the microlenses 34 is condensed mainly near the FD 12 (the n-type semiconductor region 33 in the case (B)) to undergo photoelectric conversion. As a result, before charge transfer starts (from time $t_{11}$ to time $t_{13}$), the potential $V_{FD}$ decreases by charge movement to the FD 12 or charge generation in the FD 12. The change amount of the potential $V_{FD}$ in this period will be referred to as ΔVb1. Subsequently, charge transfer is performed at time $t_{12}$ to further decrease the potential $V_{FD}$. The change amount of the potential $V_{FD}$ in this period will be referred to as ΔVb2. However, according to the case (B), the potential $V_{FD}$ decreases by ΔVb1 before charge transfer starts. This narrows a dynamic range of the output of the pixel P or readout units 25. For example, when a luminance is high, the output of the pixel P or readout units 25 exceeds a saturation level. Furthermore, when performing a CDS process, a change in the potential $V_{FD}$ of the FD 12 results in a change in the noise level of the pixel P. If performing the CDS process with this changed noise level, an image to be obtained is in a dark state.

According to the cases (C) and (D) as the first embodiment, the light having passed through the microlenses 34 is condensed mainly near the photoelectric conversion portion PD (the n-type semiconductor region 36 or n-type semiconductor region 35 in the cases (C) and (D)). Therefore, a waveform similar to that in the case (A) is obtained, and the potential $V_{FD}$ does not change or its change amount is small before charge transfer starts (from time $t_{11}$ to time $t_{13}$). In the case (C), the period in which the potential $V_{FD}$ is decreasing from time $t_{13}$ is referred to as a period Tc, and its change amount is referred to as ΔVc. Furthermore, in the case (D), the period in which the potential $V_{FD}$ is decreasing from time $t_{13}$ is referred to as a period Td, and its change amount is referred to as ΔVd. According to the cases (C) and (D), charge transfer efficiency improves more than in the case (A). For example, in the case (C), the period Tc is shorter than the period Ta when compared in the situation where the ΔVc and ΔVa are substantially equal. Hence, according to the case (C), it is possible to increase a frame rate because the readout speed of the pixel signal increases, and it is also possible to improve light sensitivity by prolonging an accumulation time of charges. Furthermore, in the case (D), for example, ΔVd is larger than ΔVa when compared in the situation where the periods Td and Ta are substantially equal. Hence, according to the case (D), the charge amount generated in the photoelectric conversion portion PD has been effectively reflected in the pixel signal.

As described above, according to the first embodiment, the optical system R2 is formed so that the centers of the respective microlenses 34, when viewed from above with respect to the X face, are positioned outside the outer edge of the n-type semiconductor region 33. This makes it possible to form the light intensity distribution in the semiconductor portion R1 so as to make the light intensity higher outside of the n-type semiconductor region 33 than inside thereof. Consequently, according to the first embodiment, it is possible to improve charge transfer efficiency while maintaining a dynamic range.

Second Embodiment

Figure 6:
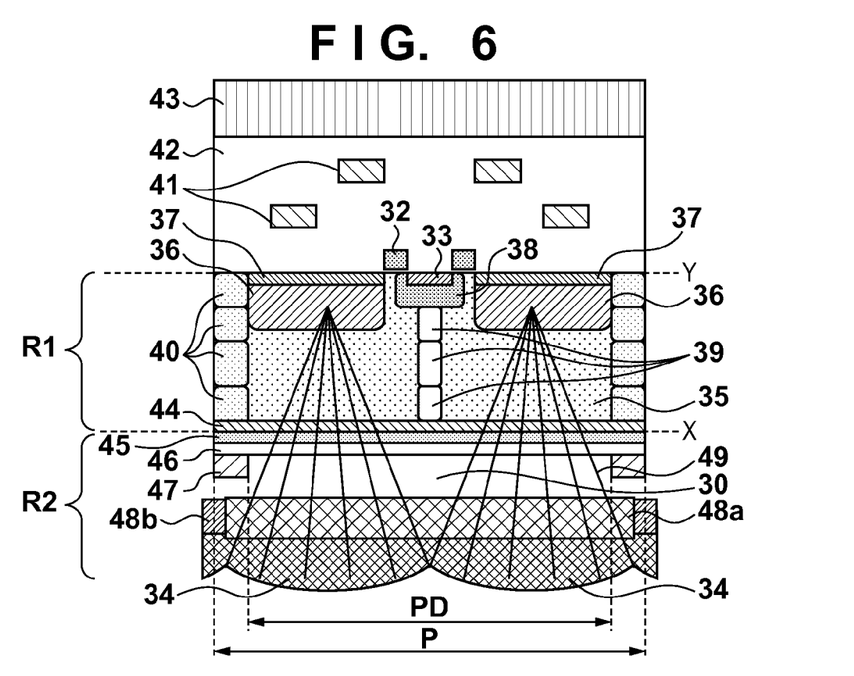
FIG. 6 is a view for explaining an example of the arrangement of a solid-state imaging apparatus according to the second embodiment.

An solid-state imaging apparatus $IS_2$ according the second embodiment will be described with reference to FIG. 6. FIG. 6 shows a sectional structural view of a unit pixel P in the solid-state imaging apparatus $IS_2$ as in FIG. 3B. The arrangement in which the negative bias is applied to the gate electrode 32 while setting the transfer transistor 11 in a non-conductive state, and the hole pinning state is set near the surface of the semiconductor portion R1 under the gate electrode 32 is exemplified in the first embodiment. However, as in the second embodiment, the arrangement in which a p-type well 38 is electrically connected to a p-type semiconductor region 44 provided on an X face side in a semiconductor portion R1 may be employed.

The p-type well 38 and p-type semiconductor region 44 can be connected to each other by providing a p-type semiconductor region 39 of the same conductivity type from the X face side to a Y face side. In this structure, a potential of the p-type well 38 is fixed to a ground potential and stabilized. According to the second embodiment, it is also possible to obtain the same effect as that in the first embodiment.

Third Embodiment

Figure 7:
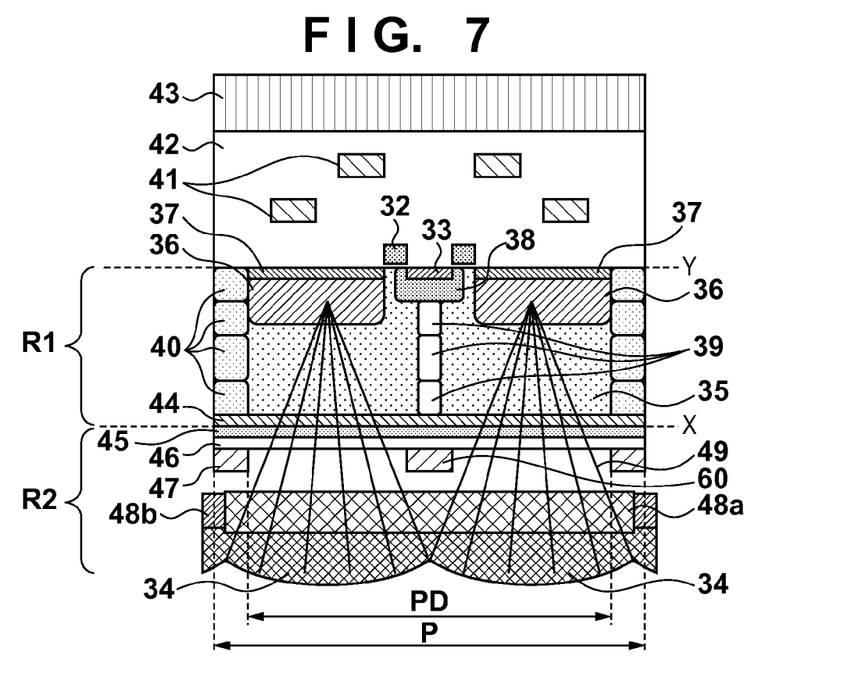
FIG. 7 is a view for explaining an example of the arrangement of a solid-state imaging apparatus according to the third embodiment.

An solid-state imaging apparatus $IS_3$ according the third embodiment will be described with reference to FIG. 7. FIG. 7 shows a sectional structural view of a unit pixel P in the solid-state imaging apparatus $IS_3$ as in FIG. 3B. The third embodiment is different from the second embodiment in that a light-shielding member 60 is provided between a semiconductor portion R1 and an optical system R2 so as to make a light intensity inside an n-type semiconductor region 33 low. The light-shielding member 60 can be arranged so that at least a part of orthogonal projection for the semiconductor portion overlaps the n-type semiconductor region 33. In other words, the light-shielding member 60 can be arranged on a normal of the Y face passing through the n-type semiconductor region 33. According to the third embodiment, in the semiconductor portion R1, a light intensity distribution can be formed so as to make the light intensity higher outside of the n-type semiconductor region 33 than inside thereof. Hence, according to the third embodiment, it is also possible to effectively obtain the same effects as those in the first and second embodiments.

Fourth Embodiment

Figure 8A:
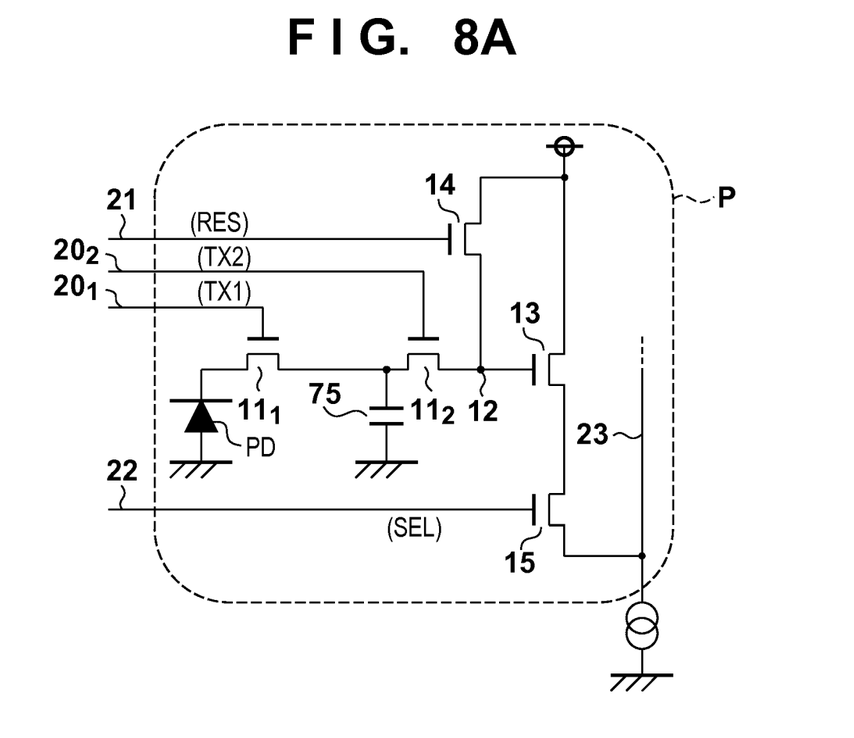
FIGS. 8A to 8C are views for explaining an example of the arrangement of a solid-state imaging apparatus according to the fourth embodiment.
Figure 8B:
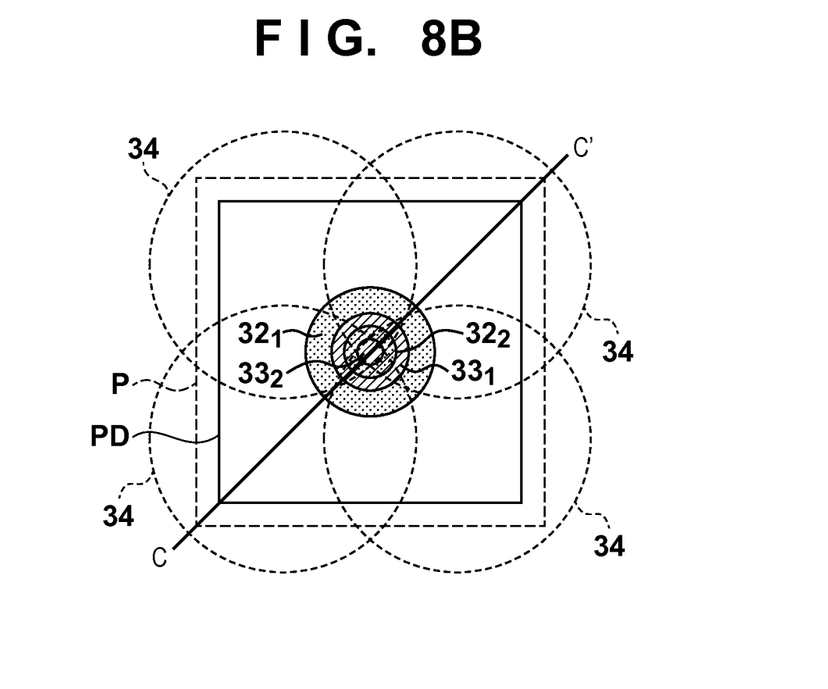
Figure 8C:
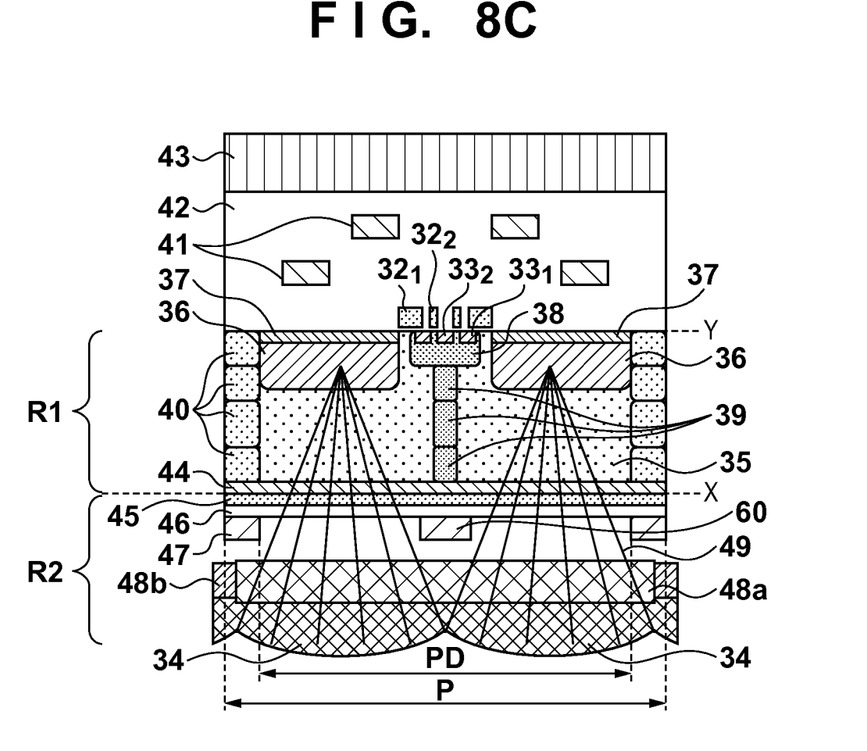

A solid-state imaging apparatus $IS_4$ according to the fourth embodiment will be described with reference to FIGS. 8A to 8C. FIGS. 8A to 8C schematically show an example of the arrangement of a unit pixel P in the solid-state imaging apparatus $IS_4$. FIG. 8A shows an example of the circuit arrangement of the pixel P as in FIG. 1, FIG. 8B shows a plan view of the pixel P as in FIG. 3A, and FIG. 8C shows a sectional structural view taken along a cut line C-C' in FIG. 8B as in FIG. 3B.

In the fourth embodiment, the pixel P, as shown in FIG. 8A, includes two transfer transistors $11_1$ and $11_2$, and a charge holding unit 75. As shown in FIGS. 8B and 8C, the drain region of the first transfer transistor $11_1$ and the source region of the second transfer transistor $11_2$ can integrally be formed by an n-type semiconductor region $33_1$ provided in a semiconductor portion R1. The charge holding unit 75 can be configured by a diffusion capacitance of the n-type semiconductor region $33_1$ (third semiconductor region). An n-type semiconductor region $33_2$ corresponds to the aforementioned FD 12.

Gate electrodes $32_1$ and $32_2$ of the transfer transistors $11_1$ and $11_2$ are arranged on a p-type well 38 provided in the central region of the pixel P via an insulating film. That is, the transfer transistors $11_1$ and $11_2$ are provided in the central region of the pixel P. As shown in FIG. 8B, the gate electrodes $32_1$ and $32_2$ of the transfer transistors $11_1$ and $11_2$ can be formed in, for example, an annular pattern with a predetermined width. In the fourth embodiment, the annular gate electrode $32_2$ is arranged inside the annular gate electrode $32_1$.

The operation sequence of the solid-state imaging apparatus $IS_4$ will be described below. A control signal TX1 is input to the gate terminal of the transfer transistor $11_1$ via a control signal line $20_1$, and a control signal TX2 is input to the gate terminal of the transfer transistor $11_2$ via a control signal line $20_2$. The transfer transistors $11_1$ and $11_2$ can individually be controlled using the control signals TX1 and TX2. This makes it possible to perform, an operation of accumulating charges in a photoelectric conversion portion PD (charge accumulation operation), and an operation of transferring charges from the photoelectric conversion portion PD to the charge holding unit 75 or an operation of transferring charges from the charge holding unit 75 to an FD 12 (charge transfer operation).

First, the first charge accumulation operation can be performed. In the first charge accumulation operation, a negative bias is applied to the gate electrode $32_1$, and charges, the amount of which corresponds to an incident light amount, are generated and accumulated in the photoelectric conversion portion PD. Then, the first charge transfer operation can be performed. In the first charge transfer operation, a positive bias is applied to the gate electrode $32_1$, and charges accumulated in the surrounding photoelectric conversion portion PD are transferred to the charge holding unit 75. While the first charge transfer operation is performed, the negative bias can be applied to the gate electrode $32_2$.

Next, the second charge transfer operation can be performed. In the second charge transfer operation, the positive bias is applied to the gate electrode $32_2$, and charges of the charge holding unit 75 are transferred to the FD 12. While the second charge transfer operation is performed, the negative bias can be applied to the gate electrode $32_1$. This operation sequence can implement a global electronic shutter. In addition, after the first charge transfer operation has completed, the negative bias is applied to the gate electrode $32_1$, and the second charge accumulation operation can be started in the photoelectric conversion portion PD. The second charge accumulation operation can be performed simultaneously with the second charge transfer operation.

Likewise, the third charge transfer operation of transferring charges accumulated in the photoelectric conversion portion PD to the charge holding unit 75 can be performed as in the first charge transfer operation, and the fourth charge transfer operation of transferring charges of the charge holding unit 75 to the FD 12 can be performed as in the second charge transfer operation. With the operation sequence described above, charge transfer efficiency can be complemented by a plurality of charge transfers to increase the output range width of the pixel P or readout units 25.

Hence, according to the fourth embodiment, it is possible to obtain the same effects as those in the first to third embodiments, and in addition to increase the output range width of the pixel P or readout units 25.

Fifth Embodiment

Figure 9A:
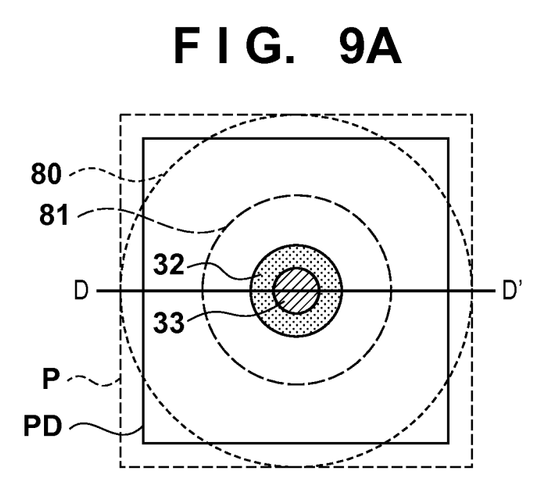
FIGS. 9A to 9C are views for explaining an example of the arrangement of a solid-state imaging apparatus according to the fifth embodiment.
Figure 9B:
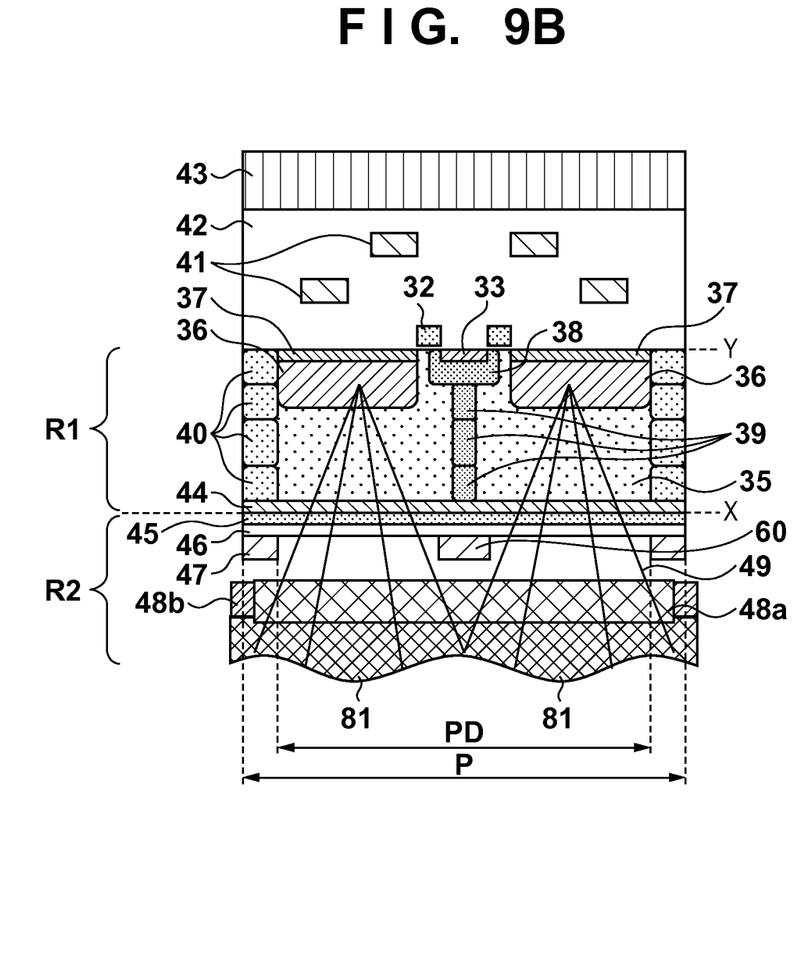
Figure 9C:
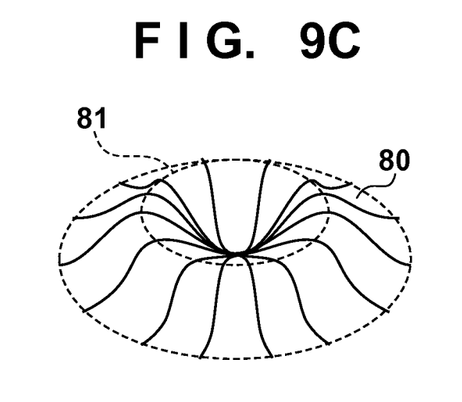

A solid-state imaging apparatus $IS_5$ according to the fifth embodiment will be described with reference to FIGS. 9A to 9C. FIGS. 9A to 9C show an example of the arrangement of a pixel P in the solid-state imaging apparatus $IS_5$. FIG. 9A shows a plan view of the pixel P as in FIG. 3A, FIG. 9B shows a sectional structural view taken along a cut line D-D' in FIG. 9A as in FIG. 3B, and FIG. 9C shows an example of the arrangement of an optical system R2 as in FIG. 3D.

The fifth embodiment is different from the third embodiment in that the optical system R2 is provided so that, as shown in FIGS. 9A and 9C, a convex shape 81 forms an annularly continuous shape using a translucent member 80. The annular convex shape 81 whose apex is positioned outside the outer edge of an n-type semiconductor region 33 is provided along this outer edge. According to another aspect of the fifth embodiment, the translucent member 80 can be provided so that the bottom of a concave shape is positioned inside the outer edge of the n-type semiconductor region 33 and the outer peripheral region of a photoelectric conversion portion PD. The translucent member 80, for example, can be formed by performing an exposure process and development process using a gray scale mask having tonality. Also, an inverted convex annular lens may be formed by an insulating film which covers a light-shielding member 60.

According to the fifth embodiment, in a semiconductor portion R1, a light intensity distribution is formed so as to make a light intensity higher outside of the n-type semiconductor region 33 than inside thereof, thus obtaining the same effects as those in the first to third embodiments.

Sixth Embodiment

Figure 10A:
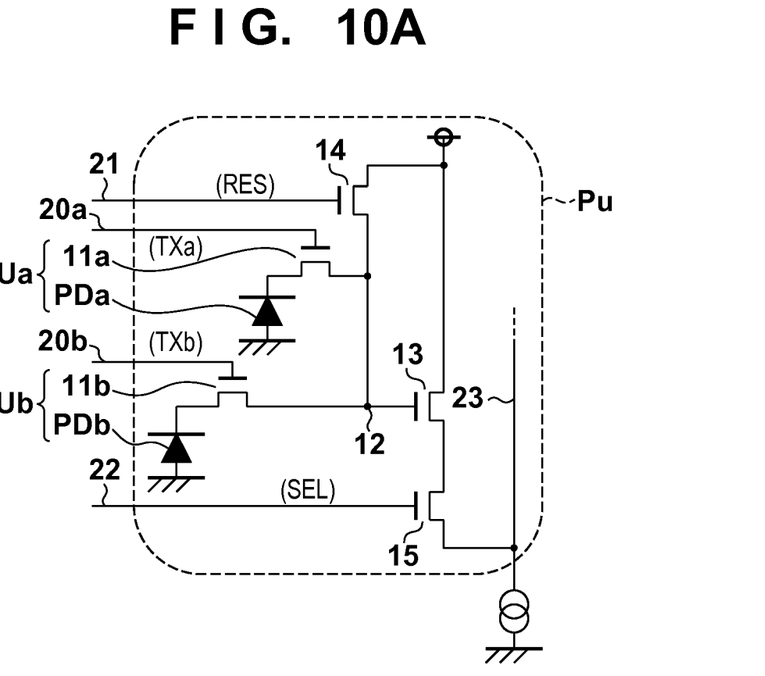
FIGS. 10A to 10C are views for explaining an example of the arrangement of a solid-state imaging apparatus according to the sixth embodiment.
Figure 10B:
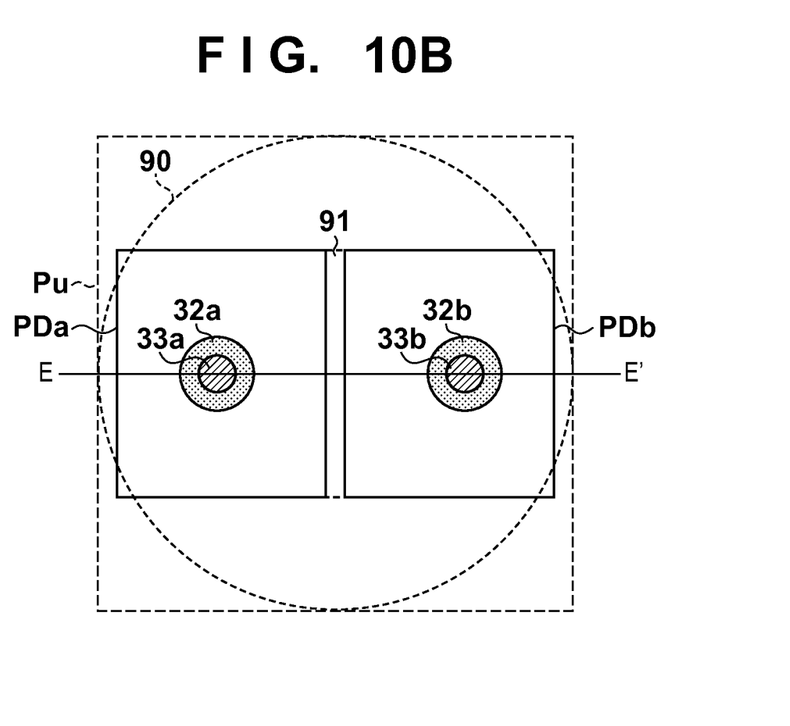
Figure 10C:
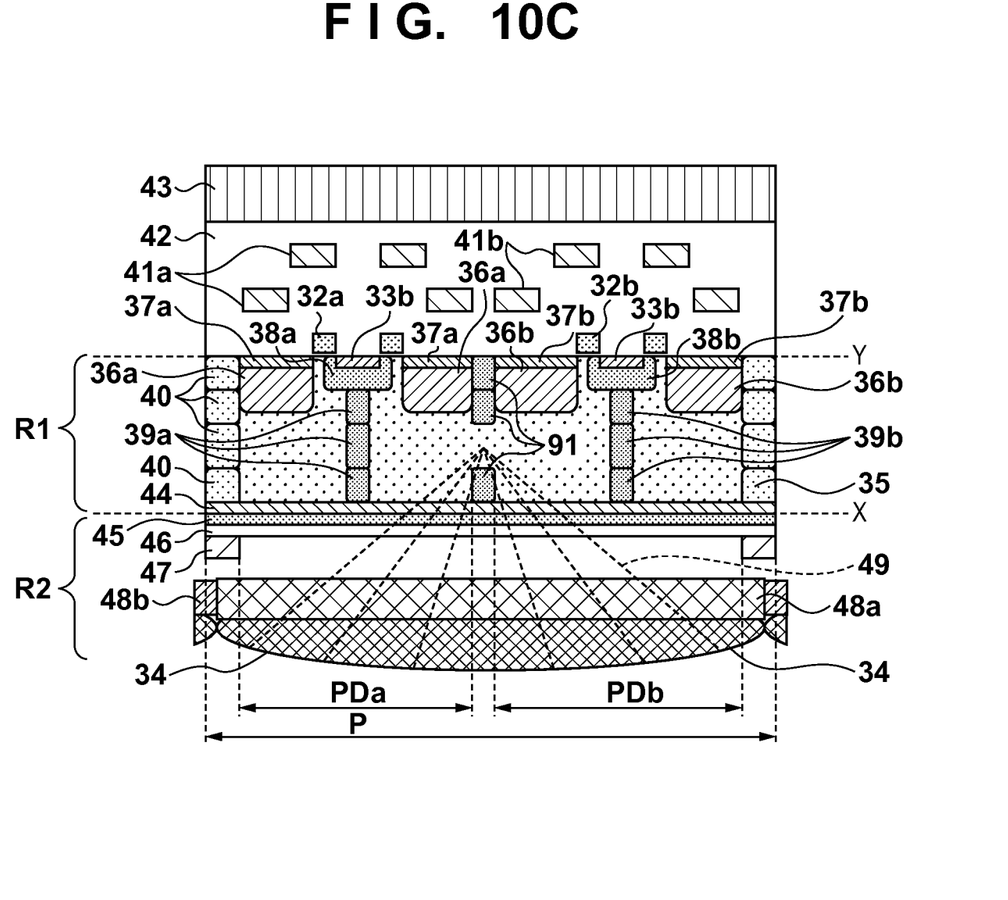

A solid-state imaging apparatus $IS_6$ according to the sixth embodiment will be described with reference to FIGS. 10A to 10C. FIGS. 10A to 10C show an example of the arrangement in a portion of a pixel unit $P_U$ in the solid-state imaging apparatus $IS_6$. FIG. 10A shows an example of the circuit arrangement of the pixel unit $P_U$ as in FIG. 1. FIG. 10B shows a plan view of the pixel unit $P_U$ as in FIG. 3A. FIG. 10C shows a sectional structural view taken along a cut line E-E' in FIG. 10B as in FIG. 3B.

As illustrated in FIG. 10A, the pixel unit $P_U$ can include a unit Ua which includes a photoelectric conversion portion PDa and transfer transistor 11a, a unit Ub which includes a photoelectric conversion portion PDb and transfer transistor 11b, an FD 12, and transistors 13 to 15.

Note that in FIGS. 10B and 10C, reference numerals of respective elements (such as a gate electrode 32, n-type semiconductor region 33, and well 38) in the unit Ua or Ub are denoted "a" or "b" in correspondence with the unit Ua or Ub. Furthermore, although not shown in FIGS. 10B and 10C, a source follower transistor 13, reset transistor 14, and selection transistor 15 can be arranged in the peripheral region of the pixel unit $P_U$.

With the above described arrangement, for example, one pixel signal may be obtained by adding signals from the respective photoelectric conversion portions PDa and PDb, and focus detection based on a phase-difference detection method may be performed by using the respective signals of the photoelectric conversion portions PDa and PDb.

Note that in the arrangement in which one pixel signal is obtained by adding, for example, the respective signals of the photoelectric conversion portions PDa and PDb, an isolation region 91 (p-type) for isolating units can be provided in an n-type semiconductor region 35 so as to divide the photoelectric conversion portions PDa and PDb. The isolation region 91 does not completely isolate the photoelectric conversion portions PDa and PDb, and they are connected in an n-type semiconductor region 35 at a deep position from a Y face of a semiconductor portion R1. When a large amount of charges is generated in one of the photoelectric conversion portions PDa and PDb, these charges diffuse to the other one of the photoelectric conversion portions PDa and PDb before leaking into an adjacent pixel beyond a potential barrier of an element isolation region 40. The isolation region 91 is not limited to the above described structure, but may be formed to have a small potential barrier, such as an impurity concentration lower than that of the element isolation region 40.

In an optical system R2 according to the sixth embodiment, as shown in FIGS. 10B and 10C, a microlens 90 is formed across the two units Ua and Ub. This makes it possible to form a light intensity distribution in the semiconductor portion R1 so as to make a light intensity high outside of an n-type semiconductor regions 33a and 33b. Hence, the sixth embodiment can also obtain the same effect as that in the first embodiment.

Although the six embodiments have been explained above, the present invention is not limited to them. The present invention can appropriately be changed in accordance with the purpose, state, application, function, and other specifications, and can also be implemented by another embodiment.

(Imaging System)

In the above embodiments, the solid-state imaging apparatus included in an imaging system represented by a camera or the like has been described. The concept of the imaging system includes not only an apparatus whose main purpose is imaging, but also an apparatus (for example, a personal computer or portable terminal) having an imaging function as an auxiliary function. The imaging system can include the solid-state imaging apparatus according to the present invention exemplified as the above described embodiments, and a processor that processes a signal output from this solid-state imaging apparatus. This processor, for example, can include an A/D converter, and a processor that processes digital data output from this A/D converter.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-103535, filed May 15, 2013, which is hereby incorporated by reference herein in its entirety.

What is claimed is:

1. A solid-state imaging apparatus which includes a semiconductor portion having a first face on the light incident side and a second face which is opposite to the first face, and an optical system arranged on the first face of the semiconductor portion, comprising:
    a first semiconductor region of a first conductivity type configured to be provided on the second face side in the semiconductor region;
    a photoelectric conversion portion configured to be provided in the semiconductor portion so as to surround the first semiconductor region, and include a second semiconductor region of the first conductivity type; and
    a gate electrode configured to be arranged between the first semiconductor region and the second semiconductor region on the second face of the semiconductor portion, and transfer a charge generated in the photoelectric conversion portion to the first semiconductor region, wherein the optical system is configured so as to make a light intensity in the second semiconductor region higher than that in the first semiconductor region.

2. The apparatus according to claim 1, wherein the optical system includes a plurality of microlenses, and the plurality of respective microlenses are formed, when viewed from above with respect to the first face, to position centers thereof outside the outer edge of the first semiconductor region.

3. The apparatus according to claim 1, wherein the optical system includes, when viewed from above with respect to the first face, a translucent member whose convex shape having its apex outside of the outer edge of the first semiconductor region is formed to be annularly continuous along the outer edge.

4. The apparatus according to claim 1, further comprising a light-shielding member configured to be arranged between the semiconductor portion and the optical system so as to make a light intensity in the first semiconductor region low.

5. The apparatus according to claim 4, wherein a part of orthogonal projection for the semiconductor portion of the light-shielding member overlaps the first semiconductor region.

6. The apparatus according to claim 1, further comprising a third semiconductor region of the first conductivity type configured to be arranged between the first semiconductor region and the second semiconductor region, and a second gate electrode, wherein the gate electrode transfers the charge in the photoelectric conversion portion to the third semiconductor region, and the second gate electrode transfers the charge in the third semiconductor region to the first semiconductor region.

7. The apparatus according to claim 1, wherein the photoelectric conversion portion, the first semiconductor region, and the gate electrode form one unit, and the optical system includes a microlens which is formed across two units.

8. The apparatus according to claim 1, further comprising a well of a second conductivity type configured to be formed so as to surround the first semiconductor region between the photoelectric conversion portion and the first semiconductor region.

9. The apparatus according to claim 8, further comprising a fourth semiconductor region of the second conductivity type configured to be provided on the first face side of the semiconductor portion and receive a reference voltage, wherein the well and the fourth semiconductor region are electrically connected to each other by the semiconductor region of the second conductivity type which is provided from the first face side to the second face side of the semiconductor portion.

10. The apparatus according to claim 1, wherein the gate electrode is an annular pattern when viewed from above.

11. A camera comprising:

a solid-state imaging apparatus according to claim 1; and a processor configured to process a signal output from the solid-state imaging apparatus.

* * * * *